United States Patent
Lin et al.

(10) Patent No.: US 11,990,524 B2
(45) Date of Patent: May 21, 2024

(54) SEMICONDUCTOR DEVICE AND FORMING METHOD THEREOF

(71) Applicant: TAIWAN SEMICONDUCTOR MANUFACTURING COMPANY, LTD., Hsinchu (TW)

(72) Inventors: Hsiao-Chien Lin, Tainan (TW); Hsi Chung Chen, Tainan (TW); Cheng-Hung Tsai, Kaohsiung (TW); Chih-Hsuan Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 222 days.

(21) Appl. No.: 17/460,833

(22) Filed: Aug. 30, 2021

(65) Prior Publication Data
US 2023/0065056 A1 Mar. 2, 2023

(51) Int. Cl.
*H01L 29/417* (2006.01)
*H01L 29/40* (2006.01)
*H01L 29/66* (2006.01)

(52) U.S. Cl.
CPC ...... *H01L 29/41775* (2013.01); *H01L 29/401* (2013.01); *H01L 29/66545* (2013.01)

(58) Field of Classification Search
CPC combination set(s) only.
See application file for complete search history.

(56) References Cited

U.S. PATENT DOCUMENTS

| | | |
|---|---|---|
| 9,105,490 B2 | 8/2015 | Wang et al. |
| 9,236,267 B2 | 1/2016 | De et al. |
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2019/0189755 A1* | 6/2019 | Glass ............... H01L 29/775 |
| 2021/0257481 A1* | 8/2021 | Hsiao ............... H01L 29/785 |

* cited by examiner

*Primary Examiner* — Mohammad A Rahman
(74) *Attorney, Agent, or Firm* — Birch, Stewart, Kolasch & Birch, LLP

(57) ABSTRACT

A method includes forming a dummy gate structure across a fin, in which the dummy gate structure has a dummy gate dielectric layer and a dummy gate electrode, forming gate spacers on sidewalls of the dummy gate structure, forming source/drain epitaxial structures on sides of the dummy gate structure, performing a first etch process to the dummy gate electrode such that a recessed dummy gate electrode remains over the fin, performing a second etch process to the gate spacers such that recessed gate spacers remain over the sidewalls of the dummy gate structure, removing the recessed dummy gate electrode and the dummy gate dielectric layer after the second etch process to form a recess between the recessed gate spacers, forming a gate structure overfilling the recess, and performing a third etch process to the gate structure such that a recessed gate structure remains between the recessed gate spacers.

20 Claims, 17 Drawing Sheets

SEMICONDUCTOR DEVICE AND FORMING METHOD THEREOF

BACKGROUND

Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
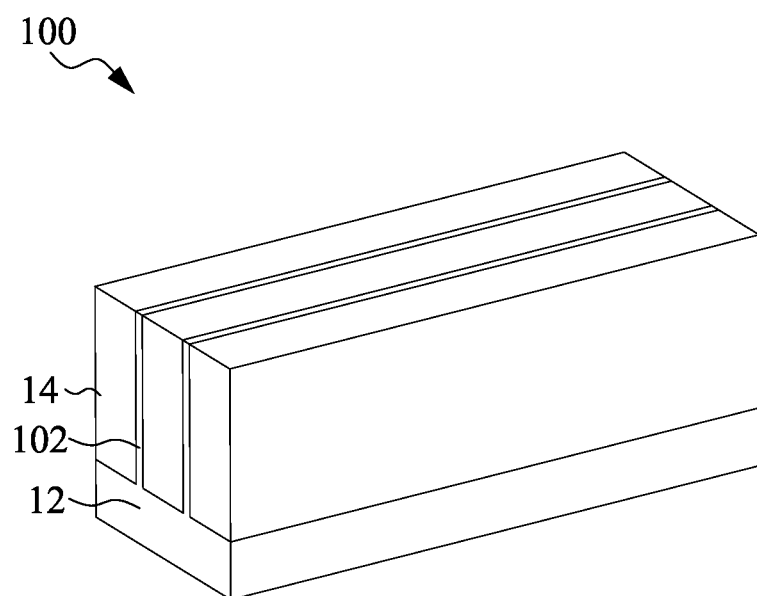
FIGS. 1, 2 and 3A illustrate perspective views of intermediate stages in the formation of an integrated circuit structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The present disclosure is generally related to integrated circuit structures and methods of forming the same, and more particularly to fabricating transistors (e.g., fin field-effect transistors (FinFETs) and gate contacts over gate structures of the transistors. It is also noted that the present disclosure presents embodiments in the form of multi-gate transistors. Multi-gate transistors include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FinFETs, on account of their fin-like structure. A FinFET has a gate structure formed on three sides of a channel region (e.g., wrapping around an upper portion of a channel region in a semiconductor fin). Also presented herein are embodiments of a type of multi-gate transistor referred to as a GA) device.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 illustrates a perspective view of an initial structure. The initial structure includes a substrate 12. The substrate 12 may be a semiconductor substrate (also called wafer in some embodiments), which may be a silicon substrate, a silicon germanium substrate, or a substrate formed of other semiconductor materials. In accordance with some embodiments of the present disclosure, the substrate 12 includes a bulk silicon substrate and an epitaxy silicon germanium (SiGe) layer or a germanium layer (without silicon therein) over the bulk silicon substrate. The substrate 12 may be doped with a p-type or an n-type impurity. Isolation regions 14 such as shallow trench isolation (STI) regions may be formed to extend into the substrate 12. The portions of substrate 12 between neighboring STI regions 14 are referred to as semiconductor strips 102.

STI regions 14 may include a liner oxide (not shown). The liner oxide may be formed of a thermal oxide formed through a thermal oxidation of a surface layer of substrate 12. The liner oxide may also be a deposited silicon oxide layer formed using, for example, Atomic Layer Deposition (ALD), High-Density Plasma Chemical Vapor Deposition (HDPCVD), or Chemical Vapor Deposition (CVD). STI regions 14 may also include a dielectric material over the liner oxide, and the dielectric material may be formed using flowable chemical vapor deposition (FCVD), spin-on coating, or the like.

Figure 2:
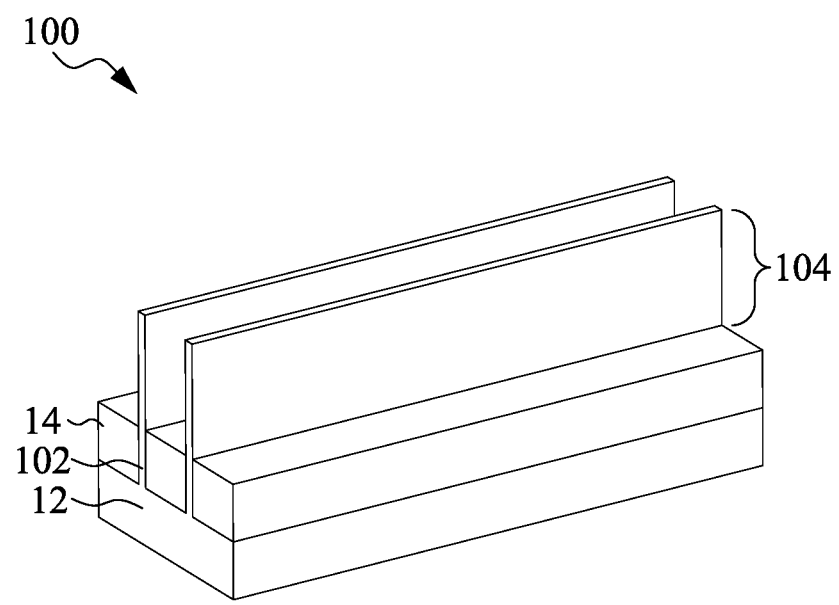

Referring to FIG. 2, the STI regions 14 are recessed, so that the top portions of semiconductor strips 102 protrude higher than the top surfaces of the neighboring STI regions 14 to form protruding fins 104. The etching may be performed using a dry etching process, wherein $NH_3$ and $NF_3$ are used as the etching gases. During the etching process, plasma may be generated. Argon may also be included. In accordance with alternative embodiments of the present disclosure, the recessing of the STI regions 14 is performed using a wet etch process. The etching chemical may include diluted HF, for example.

In above-illustrated exemplary embodiments, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

The materials of protruding fins 104 may also be replaced with materials different from that of substrate 12. For example, if the protruding fins 104 serve for n-type transistors, protruding fins 104 may be formed of Si, SiP, SiC, SiPC, or a III-V compound semiconductor such as InP, GaAs, AlAs, InAs, InAlAs, InGaAs, or the like. On the other hand, if the protruding fins 104 serve for p-type transistors, the protruding fins 104 may be formed of Si, SiGe, SiGeB, Ge, or a III-V compound semiconductor such as InSb, GaSb, InGaSb, or the like.

Figure 3A:
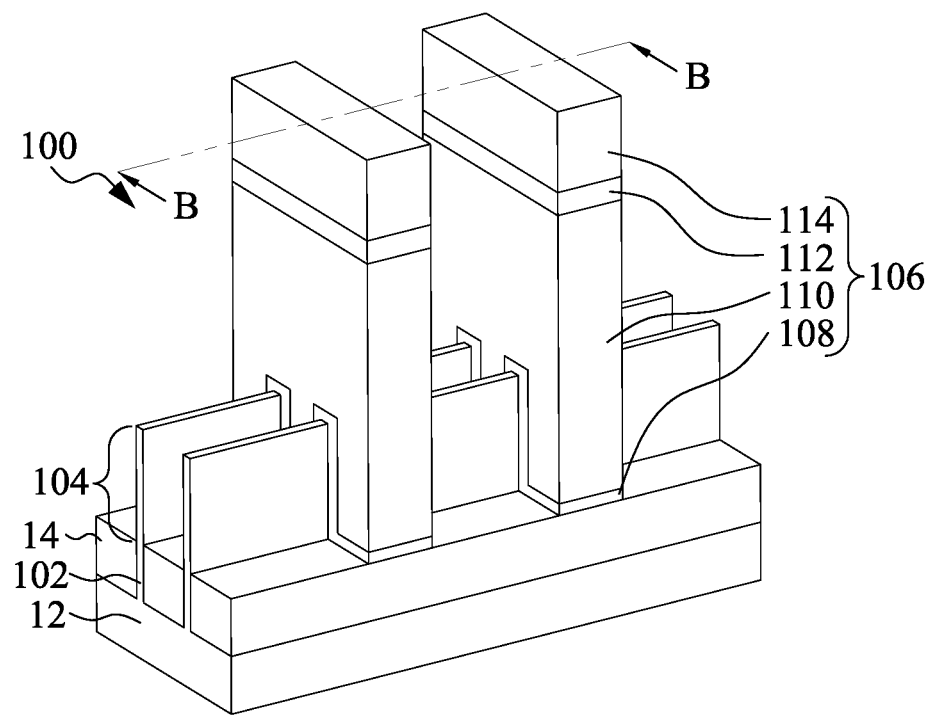
Figure 3B:
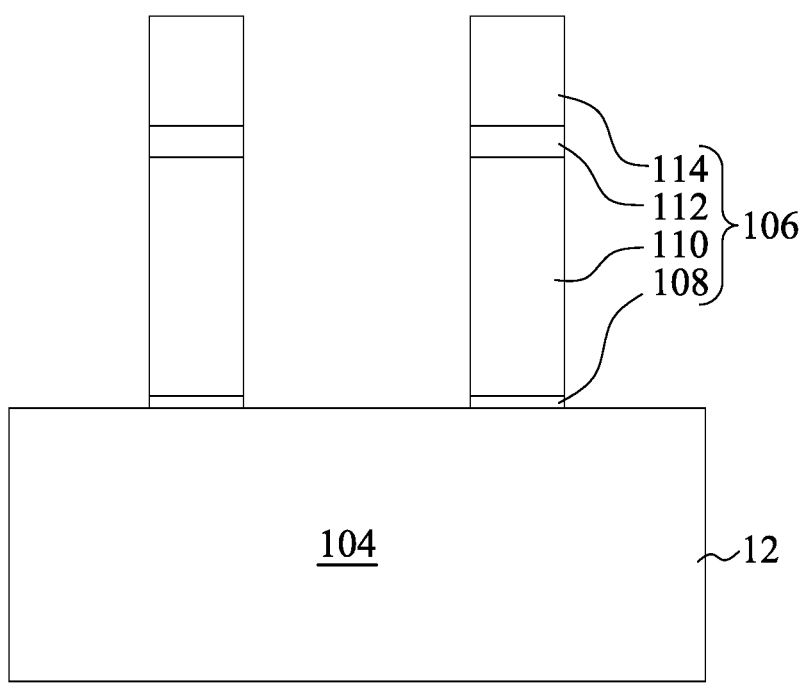
FIGS. 3B, 4, 5, 6, 7, 8, 9, 10, 11, 12, 13, 14, 15A and 15B illustrate cross-sectional views of intermediate stages in the formation of an integrated circuit structure in accordance with some embodiments of the present disclosure.

Referring to FIGS. 3A and 3B, dummy gate structures 106 are formed on the top surfaces and the sidewalls of protruding fins 104. FIG. 3B illustrates a cross-sectional view obtained from a vertical plane containing line B-B in FIG. 3A. Formation of the dummy gate structures 106 includes depositing in sequence a gate dielectric layer and a dummy gate electrode layer across the fins 104, followed by patterning the gate dielectric layer and the dummy gate electrode layer. As a result of the patterning, the dummy gate structure 106 includes a dummy gate dielectric layer 108 and a dummy gate electrode 110 over the dummy gate dielectric layer 108. The dummy gate dielectric layers 108 can be any acceptable dielectric layer, such as silicon oxide, silicon nitride, the like, or a combination thereof, and may be formed using any acceptable process, such as thermal oxidation, a spin process, CVD, or the like. The dummy gate electrodes 110 can be any acceptable electrode layer, such as comprising polysilicon, metal, the like, or a combination thereof. The gate electrode layer can be deposited by any acceptable deposition process, such as CVD, plasma enhanced CVD (PECVD), or the like. Each of dummy gate structures 106 crosses over a single one or a plurality of protruding fins 104. Dummy gate structures 106 may have lengthwise directions perpendicular to the lengthwise directions of the respective protruding fins 104.

A mask pattern may be formed over the dummy gate electrode layer to aid in the patterning. In some embodiments, a hard mask pattern including bottom masks 112 and a blanket layer of polysilicon and top masks 114 over the bottom masks 112. The hard mask pattern is made of one or more layers of $SiO_2$, SiCN, SiON, $Al_2O_3$, SiN, or other suitable materials. In certain embodiments, the bottom masks 112 include silicon nitride, and the top masks 114 include silicon oxide. By using the mask pattern as an etching mask, the dummy electrode layer is patterned into the dummy gate electrodes 110, and the blanket gate dielectric layer is patterned into the dummy gate dielectric layers 108.

Figure 4:
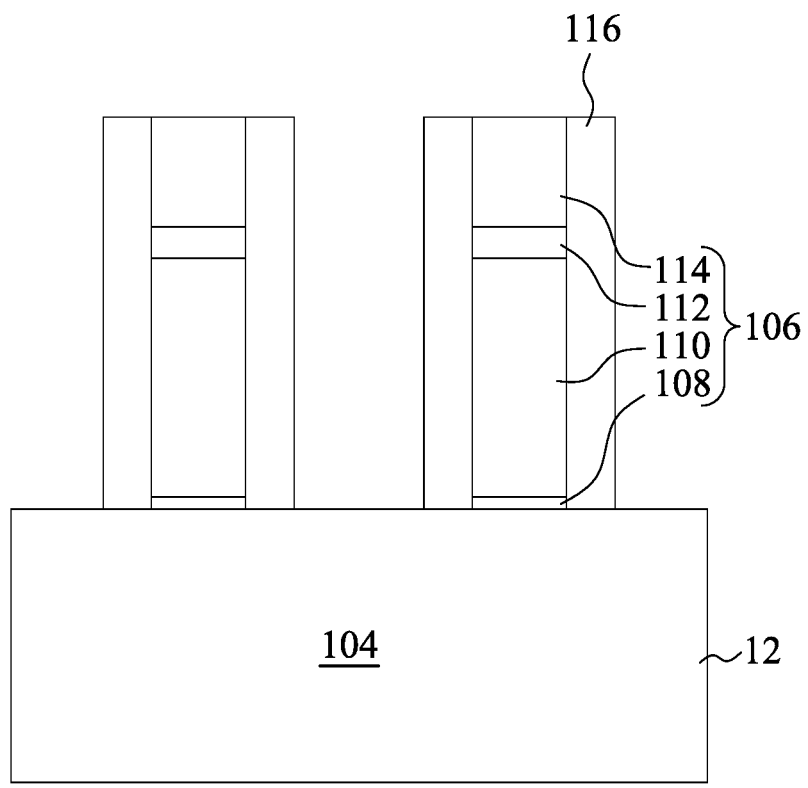

Next, as illustrated in FIG. 4, gate spacers 116 formed on sidewalls of the dummy gate structures 106. In some embodiments of the gate spacer formation step, a spacer material layer is deposited on the substrate 12. The spacer material layer may be a conformal layer that is subsequently etched back to form gate spacers 116. The spacer material layer is made of a low-k dielectric material. The low-k dielectric material has a dielectric constant (k value) of lower than about 3.5. Suitable materials for the low-k dielectric material may include, but are not limited to, doped silicon dioxide, fluorinated silica glass (FSG), carbon-doped silicon dioxide, porous silicon dioxide, porous carbon-doped silicon dioxide, SiLK™ (an organic polymeric dielectric distributed by Dow Chemical of Michigan), Black Diamond (a product of Applied Materials of Santa Clara, Calif.), Xerogel, Aerogel, amorphous fluorinated carbon, Parylene, bis-benxocyclocutenes (BCB), polyimide, polynoroboneses, benzocyclocutene, PTFE, porous SiLK, hydrogen silsesquioxane (HSQ), methylsilsesquioxane (MSQ), and/or combinations thereof. By way of example and not limitation, the spacer material layer may be formed using processes such as, CVD process, a subatmospheric CVD (SACVD) process, a flowable CVD process, an ALD process, a PVD process, or other suitable process. An anisotropic etching process is then performed on the deposited spacer material layer to expose portions of the fins 104 not covered by the dummy gate structures 106 (e.g., in source/drain regions of the fins 104). Portions of the spacer material layer directly above the dummy gate structures 106 may be completely removed by this anisotropic etching process. Portions of the spacer material layer on sidewalls of the dummy gate structures 106 may remain, forming gate spacers, which are denoted as the gate spacers 116, for the sake of simplicity. In some embodiments, the gate spacers 116 may be used to offset subsequently formed doped regions, such as source/drain regions. The gate spacers 116 may further be used for designing or modifying the source/drain region profile.

Figure 5:
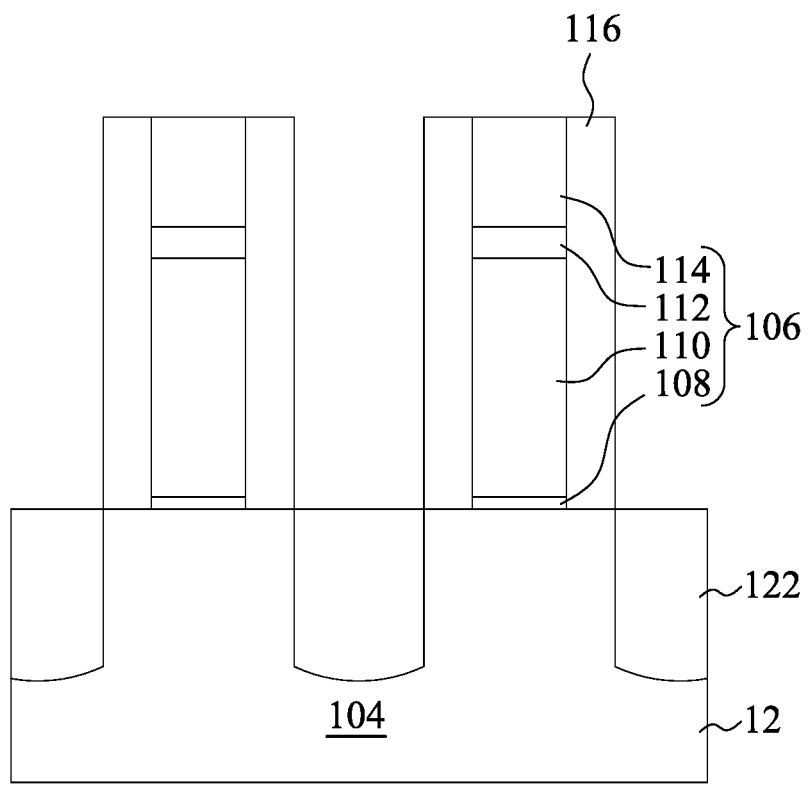

In FIG. 5, after formation of the gate spacers 116 is completed, source/drain epitaxial structures 122 are formed on source/drain regions of the fin 104 that are not covered by the dummy gate structures 106 and the gate spacers 116. In some embodiments, formation of the source/drain epitaxial structures 122 includes recessing source/drain regions of the fin 104, followed by epitaxially growing semiconductor materials in the recessed source/drain regions of the fin 104. The source/drain epitaxial structures 122 are on opposite sides of the dummy gate structure 106.

The source/drain regions of the fin 104 can be recessed using suitable selective etching processing that attacks the semiconductor fin 104, but hardly attacks the gate spacers 116 and the top masks 114 of the dummy gate structures 106. For example, recessing the semiconductor fin 104 may be performed by a dry chemical etch with a plasma source and an etchant gas. The plasma source may be inductively coupled plasma (ICR) etch, transformer coupled plasma (TCP) etch, electron cyclotron resonance (ECR) etch, reactive ion etch (RIE), or the like and the etchant gas may be fluorine, chlorine, bromine, combinations thereof, or the like, which etches the semiconductor fin 104 at a faster etch rate than it etches the gate spacers 116 and the top masks 114 of the dummy gate structures 106. In some other embodiments, recessing the semiconductor fin 104 may be performed by a wet chemical etch, such as ammonium peroxide mixture (APM), $NH_4OH$, tetramethylammonium hydroxide (TMAH), combinations thereof, or the like, which etches the semiconductor fin 104 at a faster etch rate than it etches the gate spacers 116 and the top masks 114 of the dummy gate structures 106. In some other embodiments, recessing the semiconductor fin 104 may be performed by a combination of a dry chemical etch and a wet chemical etch.

Once recesses are created in the source/drain regions of the fin 104, source/drain epitaxial structures 122 are formed in the source/drain recesses in the fin 104 by using one or more epitaxy or epitaxial (epi) processes that provides one or more epitaxial materials on the semiconductor fin 104. During the epitaxial growth process, the gate spacers 116 limit the one or more epitaxial materials to source/drain regions in the fin 104. In some embodiments, the lattice constants of the source/drain epitaxial structures 122 are different from the lattice constant of the semiconductor fin 104, so that the channel region in the fin 104 and between the source/drain epitaxial structures 122 can be strained or stressed by the source/drain epitaxial structures 122 to improve carrier mobility of the semiconductor device and enhance the device performance. The epitaxy processes include CVD deposition techniques (e.g., PECVD, vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fin 104.

In some embodiments, the source/drain epitaxial structures 122 may include Ge, Si, GaAs, AlGaAs, SiGe, GaAsP, SIP, or other suitable material. The source/drain epitaxial structures 122 may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures 122 are not in-situ doped, an implantation process (i.e., a junction implant process) is performed to dope the source/drain epitaxial structures 122. In some exemplary embodiments, the source/drain epitaxial structures 122 in an n-type transistor include SiP, while those in a p-type include GeSnB and/or SiGeSnB. In embodiments with different device types, a mask, such as a photoresist, may be formed over n-type device regions, while exposing p-type device regions, and p-type epitaxial structures may be formed on the exposed fins 104 in the p-type device regions. The mask may then be removed. Subsequently, a mask, such as a photoresist, may be formed over the p-type device region while exposing the n-type device regions, and n-type epitaxial structures may be formed on the exposed fins 104 in the n-type device region. The mask may then be removed.

Once the source/drain epitaxial structures 122 are formed, an annealing process can be performed to activate the p-type dopants or n-type dopants in the source/drain epitaxial structures 122. The annealing process may be, for example, a rapid thermal anneal (RTA), a laser anneal, a millisecond thermal annealing (MSA) process or the like.

Figure 6:
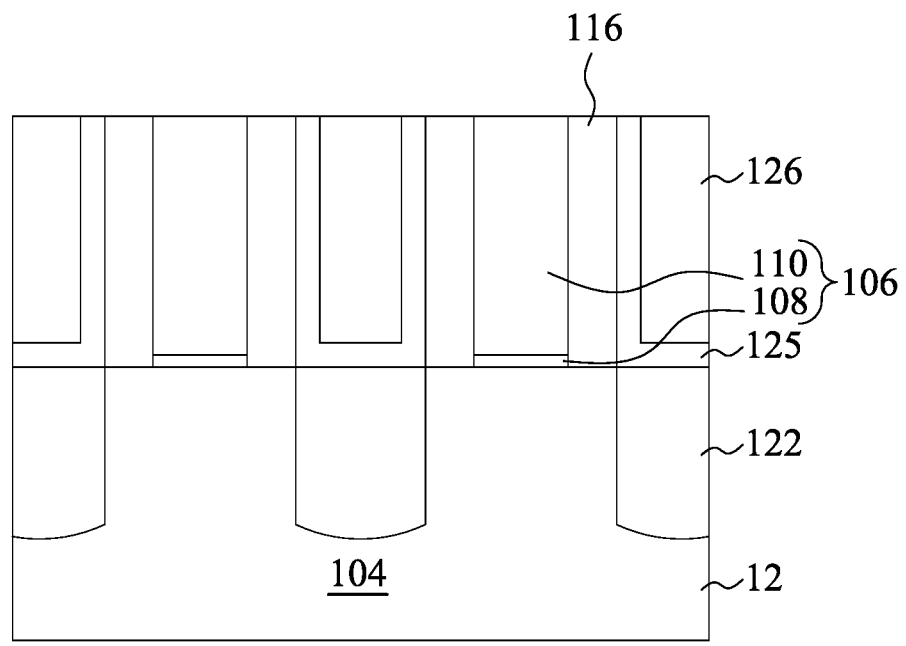

Next, in FIG. 6, a contact etch stop layer (CESL) 125 and an interlayer dielectric (ILD) layer 126 are formed on the substrate 12 in sequence. In some examples, the CESL 125 includes a silicon nitride layer, silicon oxide layer, a silicon oxynitride layer, and/or other suitable materials having a different etch selectivity than the ILD layer 126. The CESL 125 may be formed by plasma-enhanced chemical vapor deposition (PECVD) process and/or other suitable deposition or oxidation processes. In some embodiments, the ILD layer 126 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 125. The ILD layer 126 may be deposited by a PECVD process or other suitable deposition technique. In some embodiments, after formation of the ILD layer 126, the wafer may be subject to a high thermal budget process to anneal the ILD layer 126.

In some examples, after forming the ILD layer 126, a planarization process may be performed to remove excessive materials of the ILD layer 126 and the CESL 125. For example, a planarization process includes a chemical mechanical planarization (CMP) process which removes portions of the ILD layer 126 and the CESL 125 overlying the dummy gate structures 106. In some embodiments, the CMP process also removes bottom masks 112 and top masks 114 (as shown in FIG. 5) and exposes the dummy gate electrodes 110.

Figure 7:
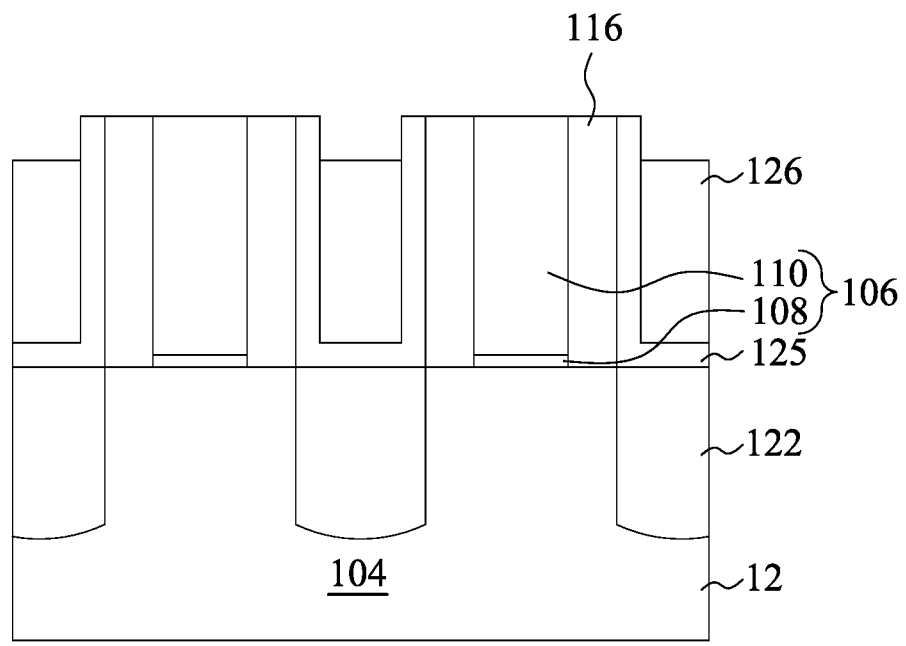

Reference is made to FIG. 7, an etch back process is performed to the ILD layer 126 to remove a top portion of the ILD layer 126. Therefore, a top surface of the ILD layer 126 is lower than a top surface of the CESL 125 and a top surface of the dummy gate structures 106. The etch back process may be performed using a dry etch process, a wet etch process or a combination thereof.

Figure 8:
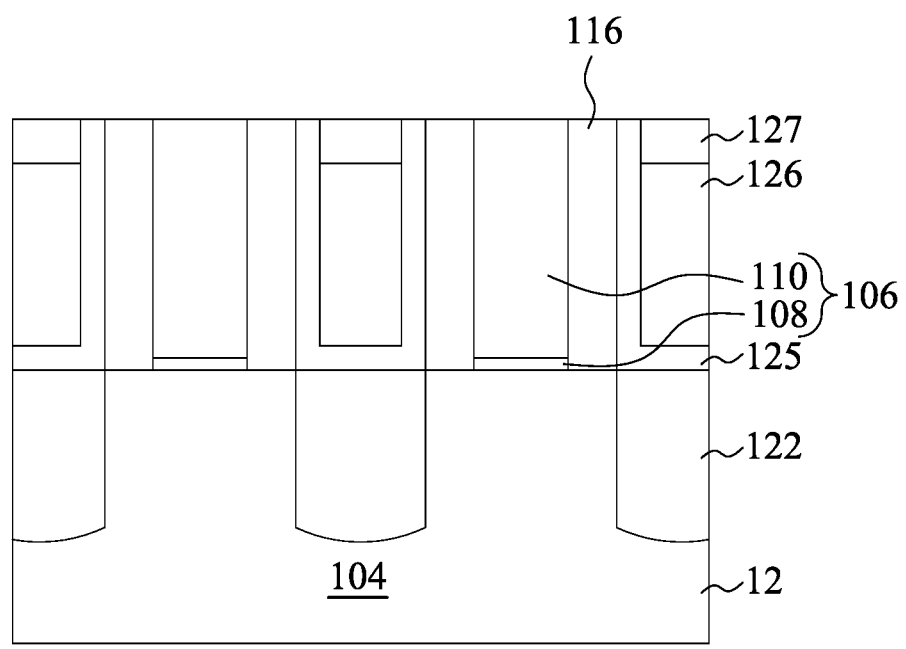

Reference is made to FIG. 8. A dielectric layer 127 is formed over the ILD layer 126 by a deposition process (e.g., CVD, ALD or the like) followed by a planarization process performed to remove excessive materials of the dielectric layer 127. For example, a planarization process includes a chemical mechanical planarization (CMP) process which removes portions of dielectric layer 127 overlying the dummy gate structures 106. In some embodiments, the dielectric layer 127 includes silicon nitride, SiON, $Al_2O_3$, SiOCN, SiCN, or combinations thereof. In some embodiments, the dielectric layer 127 has the same material as a SAC cap subsequently formed over a metal gate structure. In some other embodiments, the dielectric layer 127 has a different material from the SAC cap to fulfill different process requirements.

Figure 9:
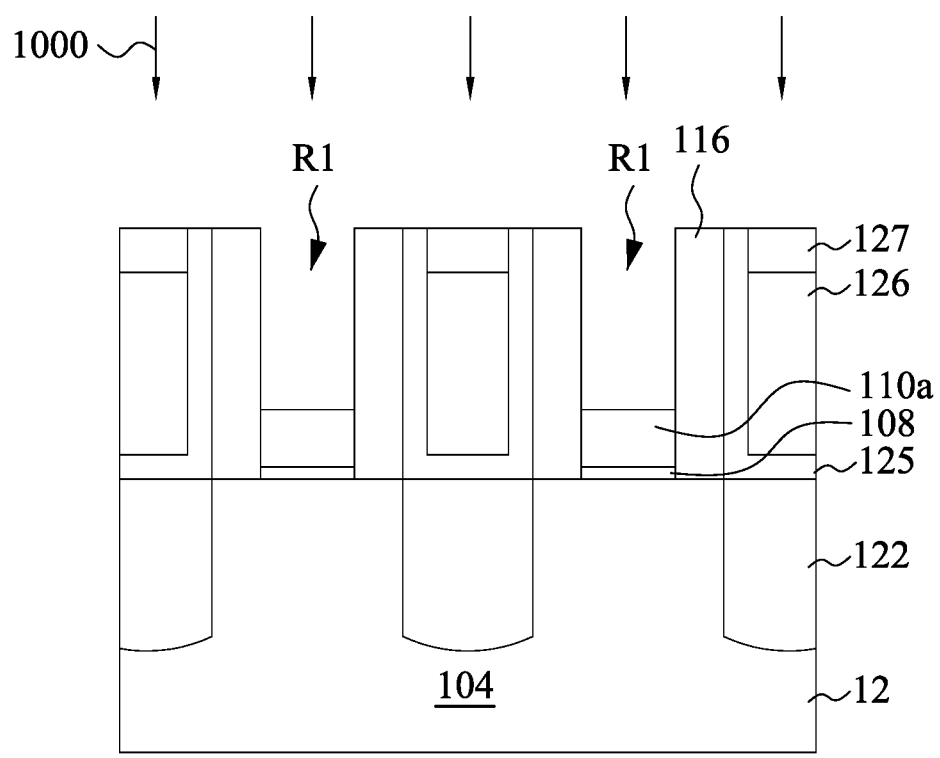

Next, as illustrates in FIG. 9, dummy gate electrodes 110 are etched back, resulting in recesses R1 between corresponding gate spacers 116. The dummy gate electrodes 110 are etched back using a first etch process 1000 that etches materials in the dummy gate electrodes 110 at a faster etch rate than it etches other materials (e.g., gate spacers 116, the CESL 125 and/or the ILD layer 126) to leave recessed dummy gate electrode 110a. A height of the dummy gate electrode 110 is reduced. As shown in FIG. 9, a top surface of the recessed dummy gate electrode 110a is lower than top surfaces of the gate spacers 116, a top surface of the CESL 125 and a top surface of the ILD layer 126. Sidewalls of the recess R1 are defined by upper sidewalk of the gate spacers 116. A bottom of the recess R1 is defined by the fin 104.

The first etch process 1000 is a dry etch process using etchants including a mixture of ammonia ($NH_3$) gas and hydrogen ($H_2$) gas. For example, a ratio of the ammonia gas to the hydrogen gas is tuned for controlling the depths of recesses R1. In some embodiments, the ratio of the ammonia gas to the hydrogen gas is in a range from about 0.2 to about 0.7. In some embodiments, the first etch process 1000 is performed at a process duration in a range from about 10 sec to about 200 sec, for example, about 30 sec to about 70 sec. If the process duration is greater than 70 sec, the dummy gate electrodes 110 may be removed entirely. If the process duration is less than 30 sec, the dummy gate electrodes 110 may be recessed too slowly. The first etch process 1000 is performed without a wet etching in this embodiment.

Figure 10:
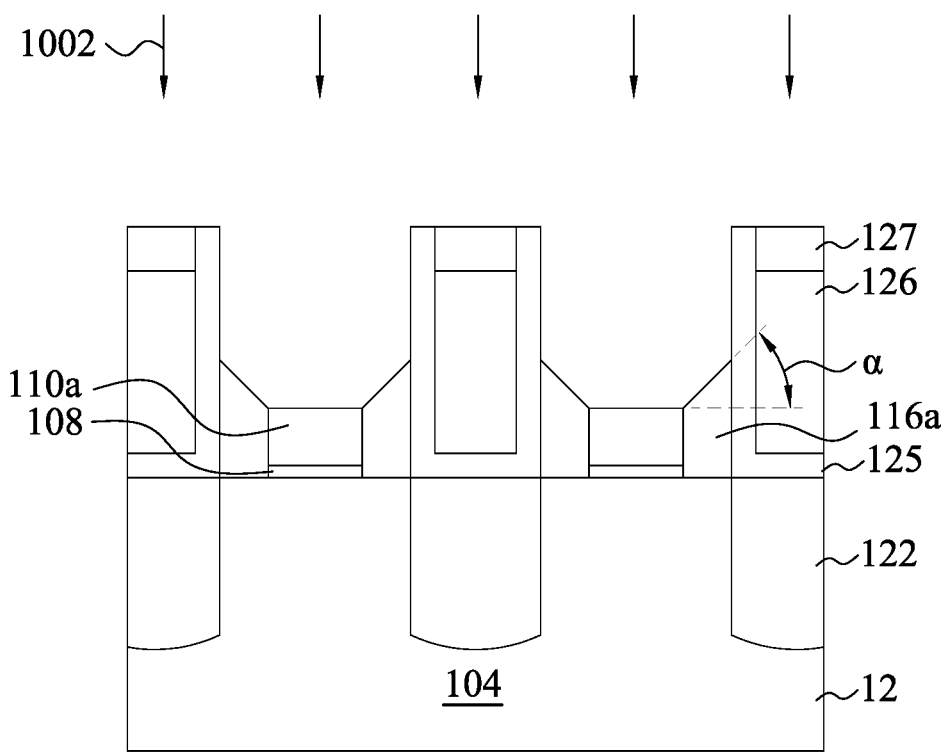

Referring now to FIG. 10, a second etch process 1002 is performed to etch back the gate spacers 116. That is, heights of the gate spacers 116 are reduced. In other words, a top portion of the gate spacers 116 is removed to leave recessed gate spacers 116a remaining over the fin 104. The gate spacers 116 are made of a material different from the CESL 125 and thus have a different etch selectivity than the CESL 125. The second etch process 1002 is a dry etch process. For example, the second etch process 1002 is a non-biased etch process and can vertically etch back the gate spacers 116.

Therefore, the second etch process 1002 would not etch the recessed dummy gate electrode 110a. The second etch process 1002 is a dry etch process using etchants including $CH_4$, $CF_4$, $N_2$, $H_2$, and Ar. The recessed gate spacers 116a are beneficial for enlarging a top critical dimension (CD) of a subsequently formed gate dielectric cap (also called SAC cap) formed over a metal gate structure replacement gate (e.g., metal gate electrode 133 in FIG. 12). The enlarged top CD of the SAC cap can improve the source/drain contact etch process window. As a result, the source/drain contact (e.g., source/drain contacts 140 in FIG. 15A) to metal gate electrode (e.g., metal gate electrode 133 in FIG. 12) leak issue can be reduced. After the second etch process 1002, the recessed gate spacers 116a have a topmost position higher than a top surface of the recessed dummy gate electrode 110a. The recessed gate spacers 116 have opposite sidewalls having different heights. In other words, a top surface of the recessed gate spacer 116a is oblique. For example, the top surface of the recessed gate spacer 116a extends obliquely downward from the ILD layer 126 to the recessed dummy gate electrode 110a. In some embodiments, the top surface of the recessed gate spacer 116a has an oblique angle α in a range from about 5 degrees to about 85 degrees.

Figure 11:
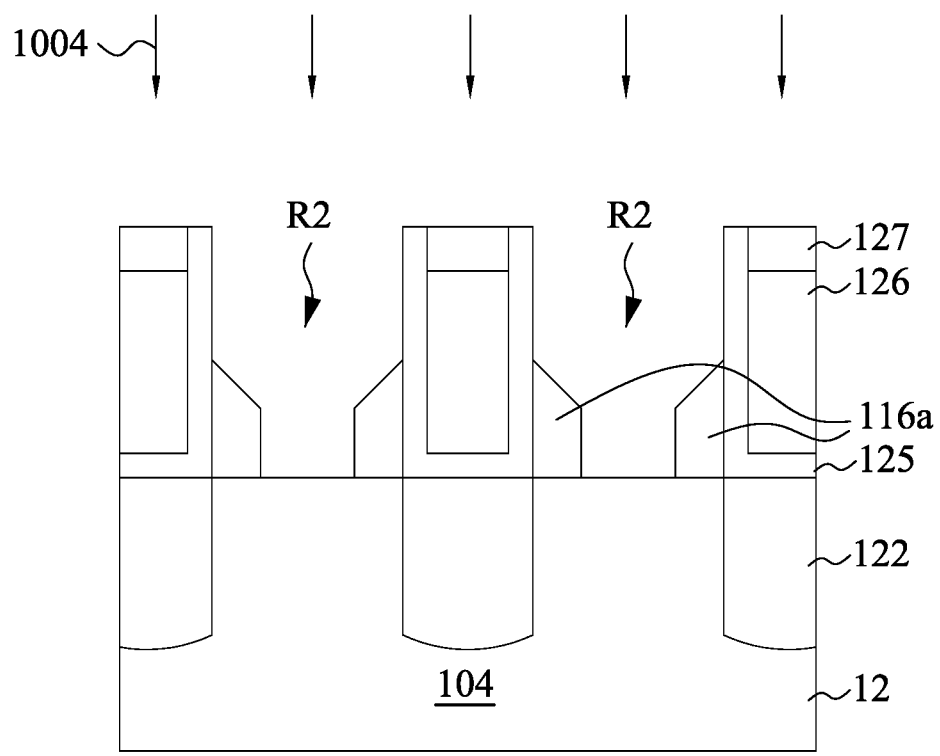

Referring to FIG. 11, a third etch process 1004 is performed to remove the recessed dummy gate electrodes 110a and the dummy gate dielectric layer 108. In some embodiments, the third etch process 1004 is a multiple-step etch process. For example, the third etch process 1004 is a dry etch process using an etchant including a mixture of ammonia ($NH_3$) gas, hydrogen ($H_2$) gas and methane ($CH_4$) gas followed by a wet etch process. The dry etch process of the third etch process 1004 using such etchant is beneficial for increasing an etch selectivity between the recessed dummy gate electrode 110a and the recessed gate spacers 116a. For example, a ratio of the methane gas to a combination of the ammonia gas and hydrogen gas is tuned for effectively remove the recessed dummy gate electrodes 110a without etching the recessed gate spacers 116a. In some embodiments, the ratio of the methane gas to the combination of the ammonia gas and the hydrogen gas is in a range from about 0.1 to about 0.4. If the ratio is less than 0.1, the recessed gate spacers 116a may be unwantedly removed during the third etch process 1004. The wet etch process is performed after the dry etch process and is used to etch the dummy gate dielectric layer 108. For example, the wet etch process may include exposure to a buffered HF solution or a buffered oxide etchant (BOE). After the third etch process 1004, the fin 104 is exposed. Sidewalls of the recessed gate spacers 116a are exposed as well. The recesses R1 are deepened to form a gate trench R2 having a lower part between the recessed gate spacers 116a.

Figure 12:
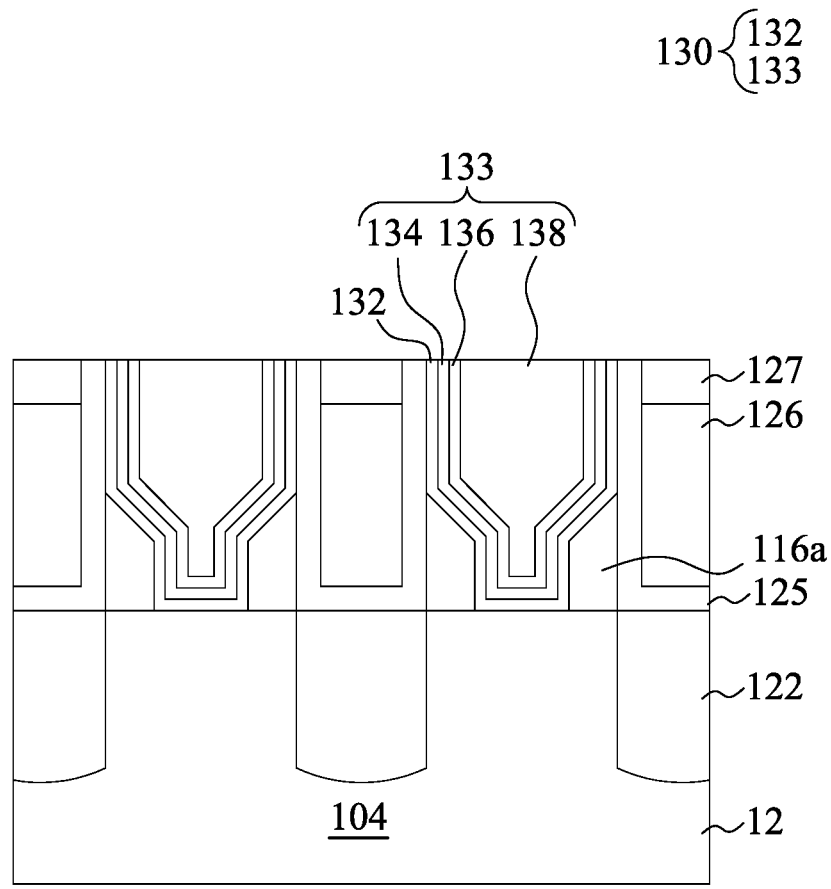

Referring now to FIG. 12, a metal gate structure 130 is formed in the gate trench R2. The metal gate structure 130 overfills the lower part of the gate trench R2 which is between the recessed gate spacers 116a. The metal gate structures 130 may be the final gates of FinFETs. The metal gate structures each may be a high-k/metal gate (HKMG) stack, however other compositions are possible. In various embodiments, the metal gate structure 130 includes a gate dielectric layer 132 lining the gate trench R2, a first work function metal layer 134 formed over the gate dielectric layer 132, a second work function layer 136, and a fill metal layer 138 formed over the second work function layer 136 and filling a remainder of the gate trench R2. The gate dielectric layer 132 includes an interfacial layer (e.g., silicon oxide layer) and a high-k gate dielectric layer over the interfacial layer. High-k gate dielectrics, as used and described herein, include dielectric materials having a high dielectric constant, for example, greater than that of thermal silicon oxide (~3.9). The first work function metal layer 134, the second work function layer 136 and/or fill metal layer 138 used the metal gate structures 130 may include a metal, metal alloy, or metal silicide. Formation of the metal gate structure 130 may include multiple deposition processes to form various gate materials, one or more liner layers, and one or more CMP processes to remove excessive gate materials.

In some embodiments, the interfacial layer of the gate dielectric layer 132 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k dielectric layer of the gate dielectric layer 132 may include hafnium oxide ($HfO_2$). Alternatively, the gate dielectric layer 132 may include other high-k dielectrics, such as hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), and combinations thereof.

The first work function metal layer 134 and the second work function layer 136 may include work function metals to provide a suitable work function for the metal gate structures 130. In an embodiment, the first work functional metal layer 134 is a p-type work function metal or p-metal. In an alternative embodiment, the first work functional metal layer 134 is an n-type work function metal. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, Al, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a desired threshold voltage Vt is achieved in the device that is to be formed in the respective region.

In some embodiments, the fill metal layer 138 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Due to the recessed gate spacers 116, the gate dielectric layer 132 has an inclined middle portion. For example, the inclined portion of the gate dielectric layer 132 extends obliquely downward from the ILD layer 126 to the fill metal layer 138. The first work function layer 134 has an inclined middle portion extending over the inclined middle portion of the gate dielectric layer 132. The second work function layer 136 has an inclined middle portion over the inclined middle portion of the first work function metal layer 134. The fill metal layer 138 has opposite inclined sidewalls. For example, the fill metal layer 138 has a narrowed middle portion having a width decreasing in a direction toward the fin 104. The fill metal layer 138 has a top width and a bottom width less than the top width.

Figure 13:
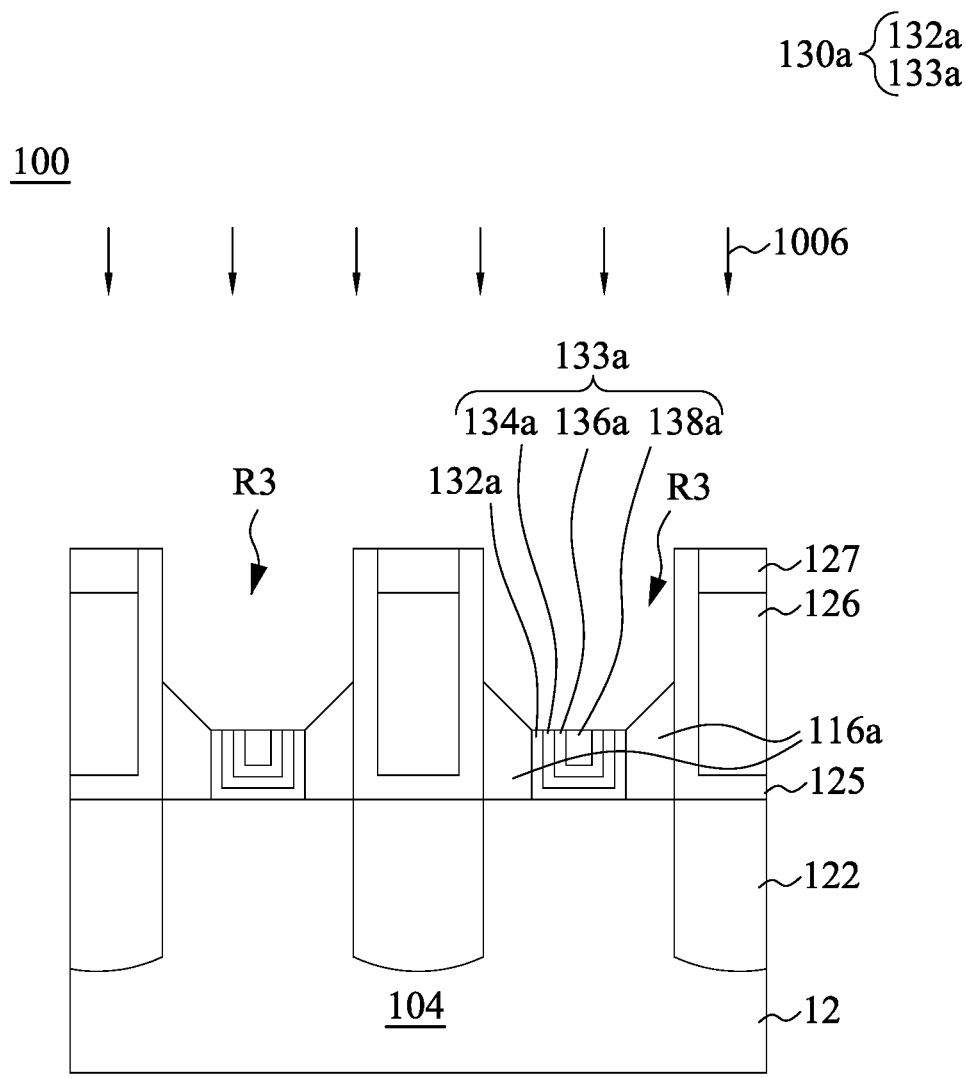

Referring to FIG. 13, a fourth etch process 1006 is performed to etch back the metal gate structure 130. In other words, a top portion of the metal gate structures 130 is removed. That is, the fourth etch process 1006 reduce a thickness of the metal gate structures 130. Recessed metal gate structure 130a remains over the fin 104 and includes remaining gate dielectric layer 132a, remaining first work function layer 134a, remaining second work function layer 136a and remaining fill metal layer 138a. The recessed replacement gate structure 130a has a top surface at a position lower than a topmost position of the recessed gate spacers 116a. The recessed metal gate structure 130a refers to as a metal gate structure. As shown in FIG. 11, a top surface of the recessed metal gate electrodes 133a is lower than the top surface of the ILD 300. The gate dielectric layers 132a have a height less than a maximum height of the recessed gate spacers 116a. The fourth etch process 1006 may be a plasma etching process using a chlorine-based gas as an etchant precursor.

In some embodiments, the fourth etch process 1006 may include one or more etch processes to etch away the materials of the metal gate structure 130. Such etch back of the metal gate structures 130 forms recesses R3 in the ILD layer 126. The sidewalls of the recesses R3 are defined by the CESL 125. The bottoms of the recesses R3 are defined by the recessed metal gate structure 130a. The gate dielectric layers 132a have a height less than a maximum height of the recessed gate spacers 116a.

Figure 14:
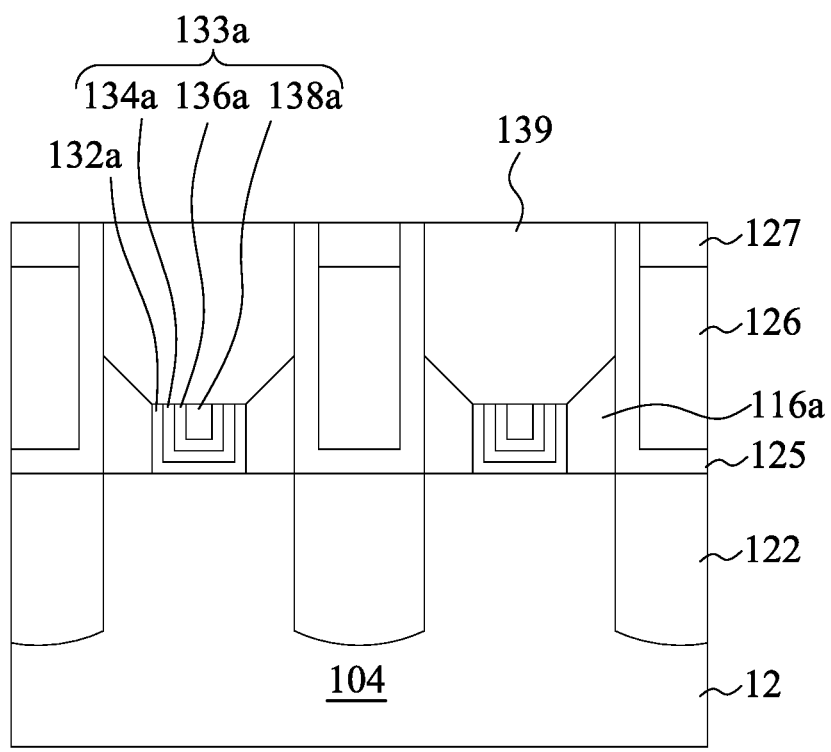

Next, gate dielectric cap layers 139 are formed deposited over the recessed metal gate structures 130a. The gate dielectric cap layers 139 may be formed by depositing a dielectric cap material over the substrate 12 until the recesses R3 are overfilled followed by a CMP process to remove the dielectric cap material outside the recesses R3, leaving portions of the dielectric cap material in the recesses R3 to serve as gate dielectric cap layers 139, as illustrated in FIG. 14. The gate dielectric cap layers 139 include SiN, SiC, SiCN, SiON, SiCON, a combination thereof or the like. The dielectric cap material is formed by a suitable deposition technique such as CVD, plasma-enhanced CVD (PECVD), ALD, remote plasma ALD (RPALD), plasma-enhanced ALD (PEALD), a combination thereof or the like. The gate dielectric caps 139 can be referred to as self-aligned contact (SAC) caps in some embodiments.

The gate dielectric cap layers 139 and the recessed gate spacers 116a have oblique interfaces. The gate dielectric cap layers 139 are formed in the recess R3 in a self-aligned manner. Each of the gate dielectric cap layers 139 has a tapered bottom portion. In other words, the bottom portion of the gate dielectric cap layer 139 has a width decreasing in a direction toward the fin 104.

The recessed gate spacers 116a has a gradient height decreasing from their outermost sidewalls (i.e., sidewalls next to CESL 125) to their innermost sidewalls (i.e., sidewalls next to the metal gate structure 130a), and thus the recessed gate spacers 116a has a maximal height proximal to the CESL 125 and a minimal height proximal to the recessed gate dielectric layer 132a. The CESL 125 has a height greater than the maximal height of the recessed gate spacers 116a. For example, the difference between the height of CESL 125 and the maximal height of the recessed gate spacers 116a is greater than zero and less than 10 nm. The maximal height of the recessed gate spacers 116a is greater than a height of the gate dielectric layer 132a. For example, the difference between the maximal height of the recessed gate spacers 116a and the height of the gate dielectric layer 132a is greater than zero and less than about 10 nm.

Opposite lower side parts of the gate dielectric cap layers 139, the CESL 125 and the recessed gate spacers 116a form corners. Due to the increased CD of the gate dielectric caps 139, the gate dielectric caps 139 cover the gate spacers 116, which allows for decreasing the corner loss (CL) of the gate spacers 116a.

Figure 15A:
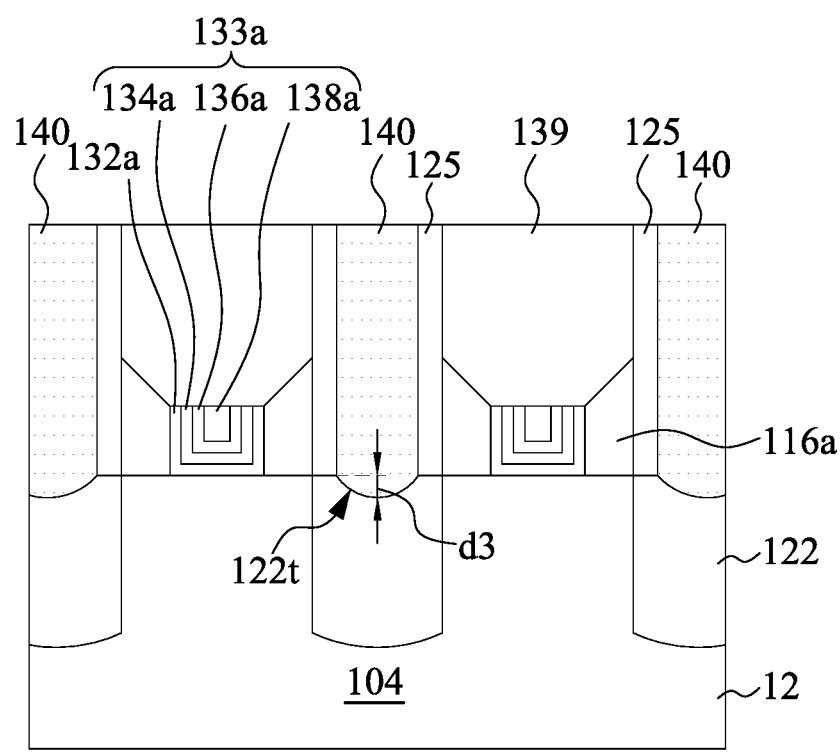

Referring to FIG. 15A, source/drain contacts 140 are formed extending through the ILD layer 126, the CESL 125, and the dielectric layer 127. The CESL 125 remains on sidewalls of the gate spacers 116a and the SAC caps 139. Formation of the source/drain contacts 140 includes, by way of example and not limitation, performing one or more etching processes to form contact openings extending though the ILD layer 126, the CESL 125, and the dielectric layer 127 to expose the source/drain epitaxial structures 122, depositing one or more metal materials overfilling the contact openings, and then performing a CMP process to remove excessive metal materials outside the contact openings.

In some embodiments, forming the contact openings through the ILD layer 126, the CESL 125 and the dielectric layer 127 causes a recess in the source/drain epitaxial structures 122. However, because the enlarged top CD of the SAC cap 139 can improve the source/drain contact etch process window as mentioned above, the source/drain epitaxial structures 122 may be recessed by a decreased amount compared with the case where no enlarged SAC cap 139 is formed. For example, a bottommost position of a top surface 122t of the source/drain epitaxial structures 122 is lower than a top surface of the fin 104 by a reduced vertical distance d3. In some embodiments, the vertical distance d3 is in a range from about 6 nm to about 6.5 nm, such as 6.2 nm.

Figure 15B:
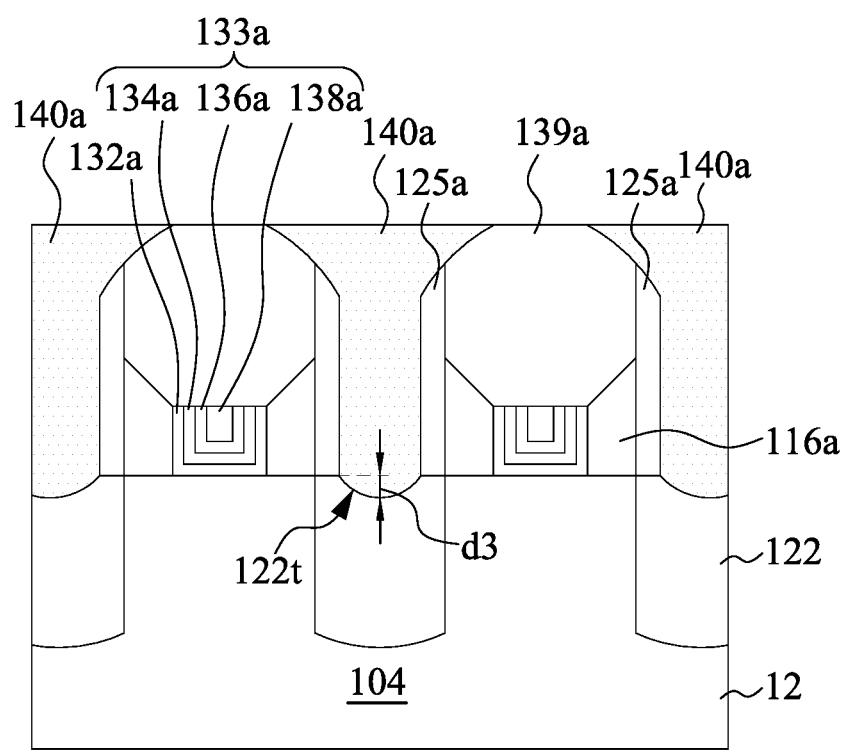

As mentioned above, because the SAC 139 has an enlarged top surface, the source/drain contact etch process window is improved. As a result, the source/drain contact 140 to metal gate electrode 133 leak issue can be reduced. Reference is made to FIG. 15B. Even if the etching process for forming the source/drain contacts 140a is performed such that the SAC 139a is over-etched to have rounded corners, the leakage between the source/drain contacts 140a and the metal gate electrode 133a may be prevented. As shown in FIG. 15B, forming the contact openings through the ILD layer 126, the CESL 125a and the dielectric layer 127 may remove portions of SAC caps 139a and CESL 152a. As a result, top portions of the SACs 139a have widths narrowing in a direction away from the fin 104. For example, upper sidewalls of the SACs 139 are inclined. In other words, the SAC caps 139a have tapered top portions. The CESL 125a has a tapered top end. Therefore, upper portions of the source/drain contacts 140a have a width increasing in a direction away from the fin 104. In some embodiments, the source/drain contacts 140a and the SAC 139a may have curved interfaces. The top surface of the CESL 125a may be curved as well.

Based on the above discussions, it can be seen that the present disclosure offers advantages. It is understood, however, that other embodiments may offer additional advantages, and not all advantageous are necessarily disclosed herein, and that no particular advantage is required for all embodiments. One advantage is that the recessed gate spacers are beneficial for enlarging a top critical dimension (CD) of a subsequently formed gate dielectric cap. Another advantage is that the enlarged top CD of the gate dielectric cap can improve the source/drain contact etch process window. As a result, the source/drain contact metal gate electrode leak issue can be reduced. Yet another advantage is that after forming the source/drain contacts, the source/drain epitaxial structures may be recessed by a decreased amount.

In some embodiments, a method of forming a semiconductor device includes forming a dummy gate structure across a fin protruding from a substrate, in which the dummy gate structure has a dummy gate dielectric layer and a dummy gate electrode over the dummy gate dielectric layer, forming gate spacers on opposite sidewalls of the dummy gate structure, forming source/drain epitaxial structures on opposite sides of the dummy gate structure, performing a first etch process to the dummy gate electrode such that a recessed dummy gate electrode remains over the fin, performing a second etch process to the gate spacers such that recessed gate spacers remain over the opposite sidewalls of the dummy gate structure, removing the recessed dummy gate electrode and the dummy gate dielectric layer after the second etch process to form a recess between the recessed gate spacers, forming a metal gate structure overfilling the recess, and performing a third etch process to the metal gate structure such that a recessed metal gate structure remains between the recessed gate spacers. In some embodiments, after the second etch process, the recessed gate spacers have a topmost position higher than a top surface of the recessed dummy gate electrode. In some embodiments, after the second etch process, top surfaces of the recessed gate spacers are oblique. In some embodiments, forming the metal gate structure includes forming a high-k gate dielectric layer in the recess. The high-k gate dielectric layer has opposite first inclined portions extending along top surfaces of the recessed gate spacers. In some embodiments, forming the metal gate structure includes forming a work function layer over the high-k gate dielectric layer. The work function layer has opposite second inclined portions over the opposite first inclined portions of the high-k gate dielectric layer. In some embodiments, forming the metal gate structure includes forming a fill metal layer filling the recess. The fill metal layer has a top width and a bottom width less than the top width. In some embodiments, after the third etch process, the top width of the fill metal layer and the bottom width of the fill metal layer are substantially the same. In some embodiments, the fill metal layer has a middle portion having a width decreasing in a direction toward the fin. In some embodiments, after the third etch process, the opposite first inclined portions of the high-k gate dielectric layer and the opposite second inclined portions of the work function layer are removed. In some embodiments, the method further includes after the third etch process, forming a gate dielectric cap layer over the recessed metal gate structure and over the recessed gate spacers. In some embodiments, the method further includes forming source/drain contacts over the source/drain epitaxial structures. During forming the source/drain contacts, the source/drain epitaxial structures are recessed.

In some embodiments, a method of forming a semiconductor device includes forming a dummy gate structure across a fin protruding from a substrate, in which the dummy gate structure has a dummy gate dielectric layer and a dummy gate electrode over the dummy gate dielectric layer, forming gate spacers on opposite sidewalls of the dummy gate structure, reducing a height of the dummy gate electrode using a first etchant without methane, reducing a height of the gate spacers, removing the dummy gate electrode using a second etchant including methane, removing the dummy gate dielectric layer to form a recess between the gate spacers, forming a metal gate structure in the recess, and forming a gate dielectric cap layer over the metal gate structure. In some embodiments, the first etchant includes ammonia gas and hydrogen gas. In some embodiments, the second etchant includes ammonia gas and hydrogen gas. In some embodiments, reducing the height of the gate spacers is performed using a non-biased etch process. In some embodiments, reducing the height of the gate spacers is performed such that the gate spacers have opposite sidewalls having different heights.

In some embodiments, a semiconductor device includes a fin, a gate structure, gate spacers, a gate cap dielectric layer and source/drain epitaxial structures. The fin extends in a first direction above a substrate. The gate structure is over the fin. The gate structure extends in a second direction perpendicular to the first direction. The gate spacers are along sidewalls of the gate structure. The gate cap dielectric layer is over the gate structure and the gate spacers. The gate cap dielectric layer has a tapered bottom portion. The source/drain epitaxial structures are on opposite sides of the gate structure. In some embodiments, the gate spacers form sloped interfaces with the gate cap dielectric layer. In some embodiments, at least one of the gate spacers has opposite sidewalls having different heights. In some embodiments, the gate cap dielectric layer has a tapered top portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    forming a dummy gate structure across a fin protruding from a substrate, wherein the dummy gate structure has a dummy gate dielectric layer and a dummy gate electrode over the dummy gate dielectric layer;
    forming gate spacers on opposite sidewalls of the dummy gate structure;
    forming source/drain epitaxial structures on opposite sides of the dummy gate structure;
    performing a first etch process to the dummy gate electrode such that a recessed dummy gate electrode remains over the fin;

performing a second etch process to the gate spacers such that recessed gate spacers remain along the opposite sidewalls of the dummy gate structure;

removing the recessed dummy gate electrode and the dummy gate dielectric layer after the second etch process to form a recess between the recessed gate spacers;

forming a metal gate structure overfilling the recess, wherein forming the metal gate structure comprises:
  forming a fill metal layer filling the recess, wherein the fill metal layer has a top width and a bottom width less than the top width, wherein the fill metal layer has a middle portion having a width decreasing in a direction toward the fin; and
  performing a third etch process to the metal gate structure such that a recessed metal gate structure remains between the recessed gate spacers.

2. The method of claim 1, wherein after the second etch process, the recessed gate spacers have a topmost position higher than a top surface of the recessed dummy gate electrode.

3. The method of claim 1, wherein after the second etch process, top surfaces of the recessed gate spacers are oblique.

4. The method of claim 1, wherein forming the metal gate structure comprises:
  forming a high-k gate dielectric layer in the recess, wherein the high-k gate dielectric layer has opposite first inclined portions extending along top surfaces of the recessed gate spacers.

5. The method of claim 4, wherein forming the metal gate structure comprises:
  forming a work function layer over the high-k gate dielectric layer, wherein the work function layer has opposite second inclined portions over the opposite first inclined portions of the high-k gate dielectric layer.

6. The method of claim 1, wherein after the third etch process, the top width of the fill metal layer and the bottom width of the fill metal layer are substantially the same.

7. The method of claim 5, wherein after the third etch process, the opposite first inclined portions of the high-k gate dielectric layer and the opposite second inclined portions of the work function layer are removed.

8. The method of claim 1, further comprising:
  after the third etch process, forming a gate dielectric cap layer over the recessed metal gate structure and over the recessed gate spacers.

9. The method of claim 8, further comprising:
  forming source/drain contacts over the source/drain epitaxial structures, wherein during forming the source/drain contacts, the source/drain epitaxial structures are recessed.

10. A method of forming a semiconductor device, comprising:
  forming a dummy gate structure across a fin protruding from a substrate, wherein the dummy gate structure has a dummy gate dielectric layer and a dummy gate electrode over the dummy gate dielectric layer;
  forming gate spacers on opposite sidewalls of the dummy gate structure;
  reducing a height of the dummy gate electrode using a first etchant without methane;
  reducing a height of the gate spacers;
  removing the dummy gate electrode using a second etchant including methane;
  removing the dummy gate dielectric layer to form a recess between the gate spacers;
  forming a metal gate structure in the recess, wherein forming the metal gate structure comprises:
    forming a fill metal layer filling the recess, wherein the fill metal layer has a top width and a bottom width less than the top width, wherein the fill metal layer has a middle portion having a width decreasing in a direction toward the fin; and
    etching back the metal gate structure; and
  forming a gate dielectric cap layer over the metal gate structure.

11. The method of claim 10, wherein the first etchant includes ammonia gas and hydrogen gas.

12. The method of claim 10, wherein the second etchant includes ammonia gas and hydrogen gas.

13. The method of claim 10, wherein reducing the height of the gate spacers is performed using a non-biased etch process.

14. The method of claim 10, wherein reducing the height of the gate spacers is performed such that the gate spacers have opposite sidewalls having different heights.

15. A method of forming a semiconductor device, comprising:
  forming a fin extending in a first direction above a substrate;
  forming a dummy gate structure over the fin, the dummy gate structure extending in a second direction perpendicular to the first direction;
  forming gate spacers along sidewalls of the dummy gate structure;
  recessing the dummy gate structure;
  after recessing the dummy gate structure, recessing the gate spacers; and
  replacing the dummy gate structure with a metal gate structure, wherein replacing the dummy gate structure with the metal gate structure comprises:
    forming a fill metal layer over the fin, wherein the fill metal layer has a top width and a bottom width less than the top width, wherein the fill metal layer has a middle portion having a width decreasing in a direction toward the fin; and
  etching back the metal gate structure.

16. The method of claim 15, wherein after recessing the gate spacers, the gate spacers have a topmost position different from a top surface of the dummy gate structure.

17. The method of claim 15, further comprising:
  forming a gate cap dielectric layer over the metal gate structure and the gate spacers, wherein the gate spacers form sloped interfaces with the gate cap dielectric layer.

18. The method of claim 17, wherein one of the sloped interfaces extends obliquely downward toward the metal gate structure.

19. The method of claim 17, wherein one of the sloped interfaces terminates at a top surface of the metal gate structure.

20. The method of claim 17, one of the sloped interfaces terminates at a sidewall of the gate spacers.

* * * * *